(12) United States Patent
Howlett

(10) Patent No.: US 6,438,017 B1
(45) Date of Patent: Aug. 20, 2002

(54) READ/WRITE EIGHT-SLOT CAM WITH INTERLEAVING

(75) Inventor: Warren Kurt Howlett, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/756,953

(22) Filed: Jan. 9, 2001

(51) Int. Cl.[7] .............................................. G11C 19/00
(52) U.S. Cl. ..................... 365/78; 365/189.12; 365/220; 365/221
(58) Field of Search ............................ 365/78, 189.12, 365/220, 221

(56) References Cited

U.S. PATENT DOCUMENTS

| | | | | |
|---|---|---|---|---|
| 4,656,626 A | * | 4/1987 | Yudichak et al. | 370/68 |
| 5,854,760 A | * | 12/1998 | Ikenaga et al. | 365/49 |
| 5,920,886 A | * | 7/1999 | Feldmeier | 711/108 |
| 5,960,459 A | * | 9/1999 | Thome et al. | 711/154 |
| 5,995,401 A | * | 11/1999 | Schultz et al. | 365/49 |
| 6,000,016 A | * | 12/1999 | Curtis et al. | 711/138 |

* cited by examiner

*Primary Examiner*—Richard Elms
*Assistant Examiner*—Tuan T. Nguyen

(57) ABSTRACT

M parallel datastreams are interleaved into a serial bitstream and shifted into a staging register, so that bit zeros of all datastreams shift in first and bit (X-1)s last. All bits of the Mth datastream occupy uniformly spaced non-adjacent memory elements interconnected with a target memory device having M memory registers each of width X. The Mth memory register of the memory device is addressed, simultaneously writing all interconnected bits to the Mth memory register within a single clock period. The bitstream is then shifted by one memory element, such that bits of the (M-1)th parallel datastream occupy the interconnected memory elements, the register address decrements, and the interconnected bits are simultaneously written to the (M-1)th register. This process iterates until M registers are written within an elapsed time of M clock periods. Reading occurs essentially in a reverse sequence.

21 Claims, 2 Drawing Sheets

READ/WRITE EIGHT-SLOT CAM WITH INTERLEAVING

BACKGROUND

Devices such as the PA-8500 processor chip have a built-in self-test (BIST) engine which is programmed by a serial interface with staging registers. A staging register is conventionally used to handle the task of reading or writing a register through a serial interface. In particular, a staging register can transfer programming instructions that are written to a BIST engine and can in addition transfer self-test data for interpretation and analysis. When writing, a staging register collects serial data until a complete word has shifted in, and then transfers that word in parallel to a target register. When reading, a word of data is transferred in parallel to the staging register and is then shifted out serially. This method performs acceptably when target and staging registers have matching widths such as those used with the PA-8500, but is inefficient for mismatched target and staging register widths.

Accordingly, it would be advantageous to develop a system and method of efficiently programming a BIST engine incorporating narrow target registers. Additionally, it would be advantageous to develop such a method and system having simplified circuitry and operation. Moreover, it would be advantageous to develop such a system and method utilizing existing hardware and BIST register methodology to the greatest extent feasible.

SUMMARY OF THE INVENTION

The present invention is directed to a system and method that interface to the existing BIST register methodology and which employ a staging register to write to and read from a memory device having narrow memory registers.

Staging registers incorporate existing technology, but interfacing interleaved data in a wide staging register with a narrow register file, for example an eight-slot content addressable memory (CAM) with 10-bit slot width, in accordance with the present invention, provides new two-fold advantages. First, all the CAM slots can be loaded in a single shift operation instead of eight individual operations which would otherwise have been required. Second, the circuitry required is simplified by interleaving the data bits, such that reads and writes occur in eight consecutive clock periods. This system and method handle a stream of data as it is shifting within a staging register and transfer it to the CAM slots at the appropriate time.

In writing to a CAM or other target memory device having M memory registers, e.g., CAM slots, each with a width of X bits, M parallel datastreams are interleaved using conventional hardware or software techniques into a serial bitstream, which is then shifted into a staging register of N memory elements, such that typically N is greater than the product of X and M. The bits are interleaved within the bitstream so that all of the bit zeros of the interleaved datastreams shift in first, followed by all of the bit ones, the bit twos, . . . , and finally the bit (X−1)s. The bits are aligned so that all X value bits of the Mth parallel datastream occupy uniformly spaced non-adjacent memory elements that are interconnected with the input port of the target memory device. Concurrently the Mth memory register of the memory device is addressed, simultaneously writing all X bits to the Mth slot or register of the memory device. This simultaneous parallel writing operation occurs within a single clock period of the system. The bitstream is then shifted by one memory element, such that the bits of the (X−1)th parallel datastream now occupy the memory element locations interconnected with the memory device, the memory device address is decremented, and X bits are simultaneously written to the (X−1)th register of the memory device. This process is iterated until all M registers have been written within a total elapsed time of M clock periods.

Reading data from the memory device is performed in essentially a reverse process, incorporating interatively decrementing the memory register address, parallel reading all of the contents of the memory register into non-adjacent memory elements of the staging register, and shifting the bitstream in the staging register to interleave the bits from the next read cycle. As with writing, reading of all M registers occurs within an elapsed time of M clock periods. After reading, the interleaved bitstream is shifted out of the staging register and is de-interleaved using conventional hardware or software techniques.

The principles of the invention can be applied to a variety of configurations, including various bit widths and numbers of CAM slots, for example 16 CAM slots each 6 bits wide. Alternatively, the CAM can be replaced for example by a register file, a small segment of a larger memory, or a collection of narrow registers that communicate with a wide staging register.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figures 1A, 1B:
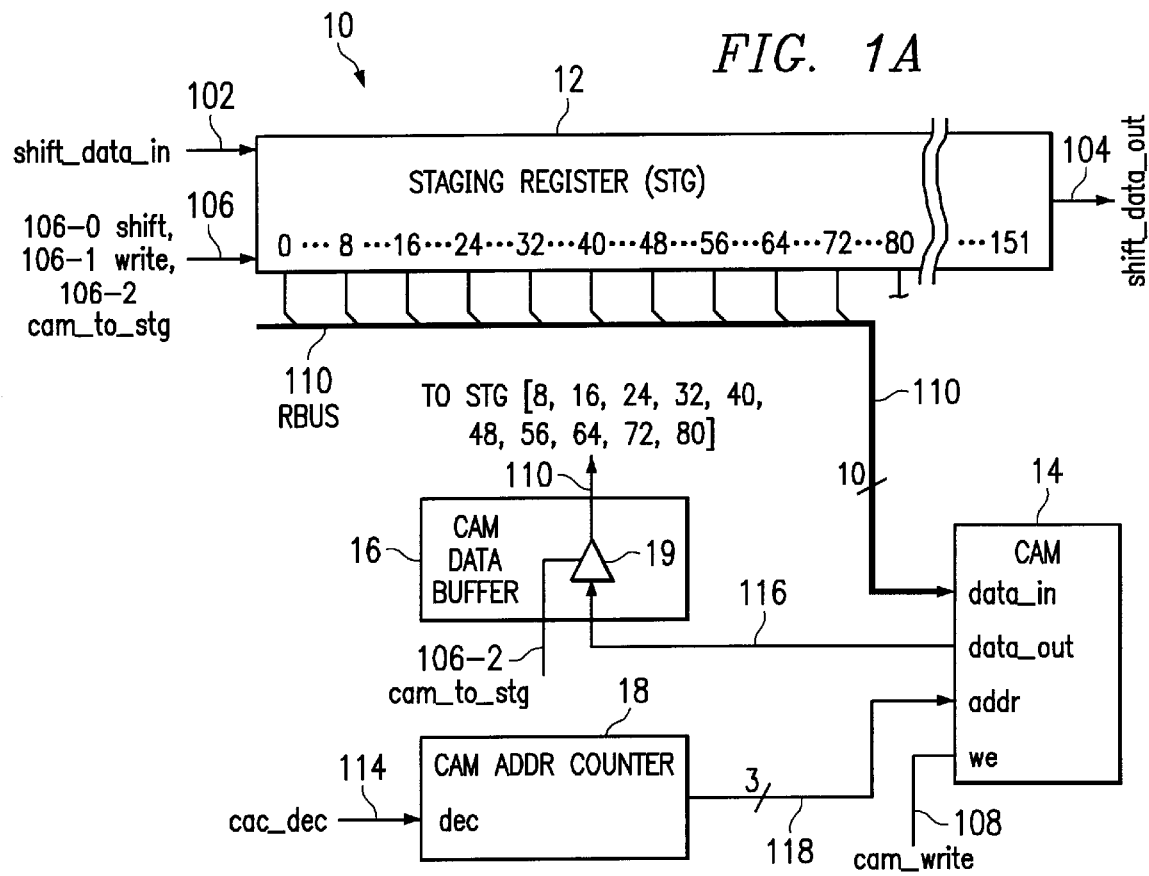
FIGS. 1A and 1B together form a simplified schematic diagram illustrating a staging register (STG) interconnected with an eight-slot content addressable memory (CAM), according to an embodiment of the present invention.

FIGS. 1A and 1B together form a simplified schematic diagram illustrating a staging register (STG) interconnected with an eight-slot content addressable memory (CAM), according to an embodiment of the present invention. Typically staging register 12 is 152 bits (memory elements) wide and communicates through a 152-bit parallel rbus 110 with a stack of other staging registers (not shown) which are all also 152 bits wide. In some implementations, other register widths and/or numbers of registers are used, including single-register implementations. However, these alternative implementations are logical equivalents of the embodiment illustrated in FIGS. 1A–1B. For simplicity, not all memory elements of staging register are shown in FIG. 1A, and only selected memory elements are shown connected to rbus 110.

Staging register (STG) 12 has one serial input port (shift_data_in) 102, one serial output port (shift_data_out) 104, three control bit inputs (shift 106-0, write 106-1, and cam_to_stg 106-2) at control port 106, and has an input/output connection to a parallel data bus (rbus) 110. Serial data input port 102 feeds shift_data_in signals into staging register 12. Shift control bit 106-0 is high when staging register 12 is to shift. Write control bit 106-1 is high when the shift is a write operation and is low when the shift is a read operation. Cam_to_stg control bit 106-2 is high for a read operation and low for a write operation, when the CAM has been selected for reading/writing. A serial data output port 104 outputs shift_data_out signals from staging register 12.

A CAM 14 can be thought of as a register file with eight registers, each of which is ten bits wide. CAM 14 has a 10-bit data-in port connected through rbus 110 to memory elements 0, 8, 16, 24, 32, 40, 48, 52, 64, and 72 of staging register 12 and a 10-bit data_out port interconnected through a 10-bit wide interconnect bus 116 to a CAM data buffer 16. Additionally, CAM 14 has a 3-bit addr port connected to a CAM address counter 18 through an address line 118, and a write enable (WE) control port connected to a CAM shift control 13 (see FIG. 1B). When a WE control bit is high, the value present on data_in port is loaded into a CAM slot selected by the 3-bit addr control on the CAM addr port, originating at CAM address counter 18. When WE is low, the data of the CAM slot selected by the 3-bit addr control is read out through the CAM data_out port through interconnect bus 116 to CAM data buffer 16. When cam_to_stg bit 106-2 is high, CAM data buffer 16 accepts the data from the data_out port of CAM 14 and drives it onto bits 8, 16, 24, 32, 40, 48, 56, 64, 72, and 80 of rbus 110 connected to the corresponding memory elements of staging register 12.

CAM address counter (CAC) 18 is a 3-bit counter. It has one control input bit (cac_dec) on a control interconnect 114 and a 3-bit output through address line 118 to the addr port of CAM 14. When the cac_dec control signal is high, CAM address counter 18 decrements by one, and the current value of the counter is driven onto address line 118.

Referring to FIG. 1B, a shift counter 15 has two control inputs, write 106-1 and shift 106-0, and four output bits, wready 122, 8writes 124, 8reads 126, and rready 128. While a shift is occuring, shift counter 15 begins counting. It has two modes, depending on the status of write control bit 106-1. If write control bit 106-1 is high, then a predetermined count threshold is set and when reached, wready goes high followed 8 clock cycles later by 8writes also going high. If write control bit 106-1 is low (indicating a read), then shift counter 15 waits for 8 clock cycles and then drives 8reads high. It then counts to a different predetermined threshold before setting rready high.

CAM shift control 13 has six input control bits, write 106-1 and cam_addr 112, wready 122, 8writes 124, 8reads 126, and rready 128, and three output control bits, cam_to_stg 106-2, cam_write 108, and cac_dec 114, which are described below in more detail.

Prior to entering staging register 12 at input port 102, a serial bitstream is interleaved, such that all the bits of a given bit position of all eight CAM slots are grouped together. In other words, all the bit 0's from all eight slots shift in first, then all the bit 1's, then all the bit 2's and so on through all the 9's for each of the 10-bit wide slots. After this interleaved bitstream is shifted into the register, the bits are prealigned advantageously, such that the ten bits for CAM slot 7, for example, are all simultaneously connected to rbus 110 and are therefore parallel-transferrable to slot 7 of CAM 14 within a single clock period write operation, without further reordering. After this first write cycle, then staging register 12 shifts and CAM 14 address decrements synchronously, thus aligning all of the ten bits intended for CAM slot 6 for parallel write to CAM 14 within the next consecutive clock period. This process is iterated until all eight slots of CAM 14 are written/read within a block of 8 consecutive clock periods. This results, for example, in an efficient method for writing programming instructions to a BIST engine.

Likewise, after reading data, for example self-test measurement results, from CAM 14 to STG 12 and after the serial bitstream is shifted out, it must typically be de-interleaved before interpretation and analysis. These reading and de-interleaving operations are performed in essentially a reverse fashion relative to the previously described interleaving and writing operations.

In some implementations, the interleaving of the bits of eight parallel bitstreams into a single serial interleaved bitstream is accomplished by a programmer using conventional software techniques. This approach simplifies the required hardware and improves flexibility. In other embodiments, interleaving is implemented in hardware, for example involving MUX chips. Similarly, de-interleaving can be implemented either in conventional software or hardware.

As shown in FIGS. 1A–1B, there are three independent external control bits, namely a shift bit 106-0, applied to both STG 12 and shift counter 15, which is high when STG and CAM are shifting; a cam_addr bit 112, which when high tells CAM shift control 13 that the CAM is selected for a read/write operation; and a write bit 106-1, applied to STG 12, shift counter 15, and CAM shift control 13. Write bit 106-1 goes to CAM shift control 13, to distinguish between read and write operations. Shift counter 15 needs to have write bit 106-1, so that it knows to produce wready or rready signals.

All other control bits are generated internally in response to combinations of the above three external control bits. Intermediate control bits generated by shift counter 15 include:

wready 122, which is high if both write 106-1 and shift 106-0 are high for a predetermined count and enables cam_write 108 and cac_dec 114 to initiate eight writes sequentially from the interleaved bits of STG 12 to the eight slots of CAM 14. Both STG 12 and CAM 14 shift synchronously in one-step decrements during this operation;

8writes 124, which goes high when the eight-write operation is completed and disables cam_write 108 and cac_dec 114. Write 106-1 and shift 106-0 are external inputs to the device and already "know" when to turn off. 8writes initiates a return to the beginning of the read/write cycle;

8reads 126 is driven high when an eight-read cycle is completed and disables cam_to_stg 106-2 and cac_dec 114; and rready 128 is driven high after the 8 reads timeout by shift counter 15 and initiates a return to the beginning of the read/write cycle.

Control bits generated by CAM shift control 13 in response to combinations of the above described control bits include: cam_to_stg 106-2, applied to STG 12 and CAM data buffer 16, when high indicates a data read from CAM 14 to STG 12; cam_write 108, applied to CAM write enable input, enables data write from STG 12 to CAM 14; cac_dec 114, applied to CAM address counter 18, decrements the three-bit CAM address control on address line 118 in one-slot steps.

Figure 2:
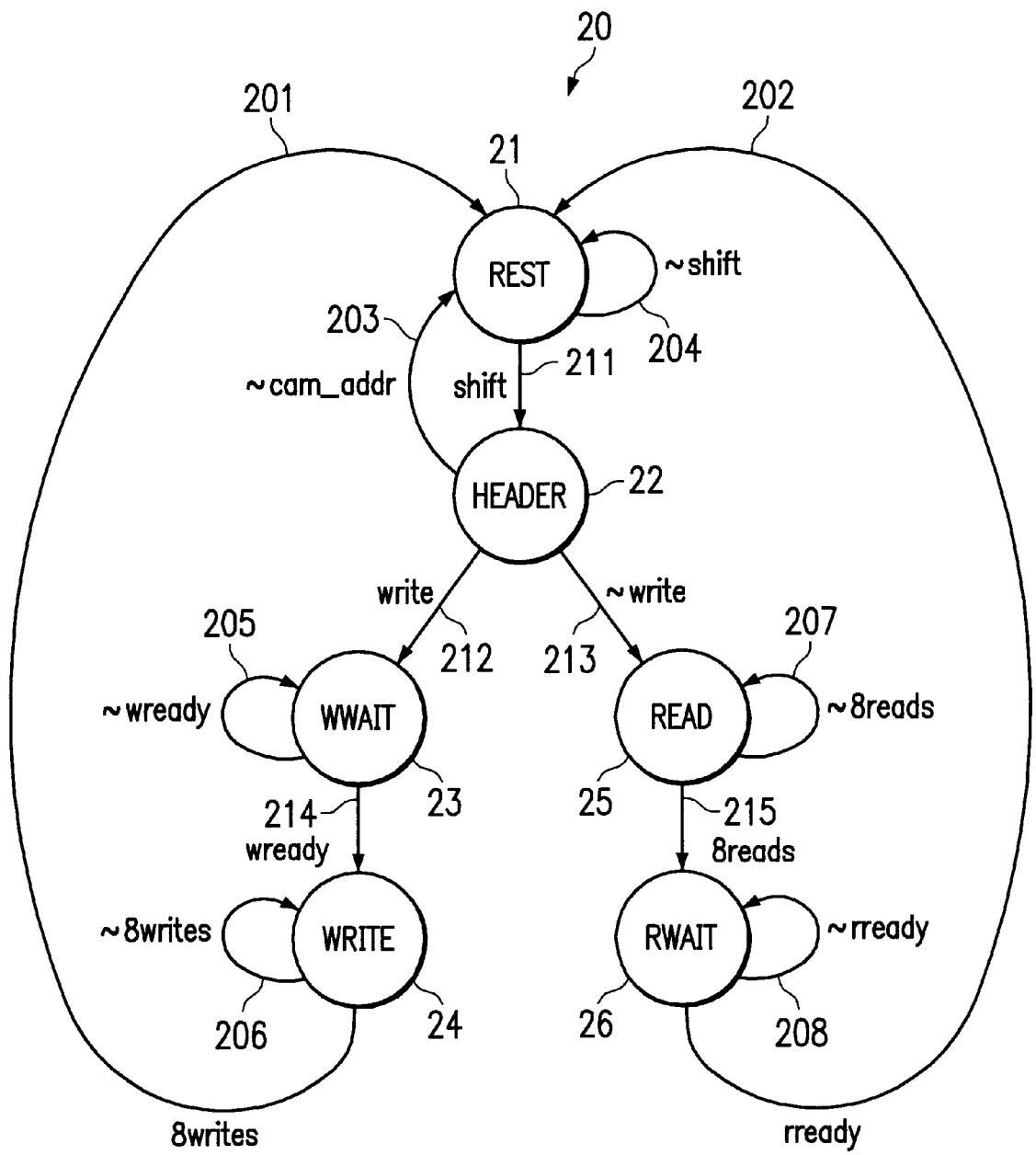
FIG. 2 is a state diagram logically illustrating the operation of the embodiment depicted in FIGS. 1A–1B.

FIG. 2 is a state diagram logically illustrating the operation of the embodiment depicted in FIGS. 1A–1B. Each circle 21 through 26 represents a state. The system moves from one state to another when the proper conditions exist as shown by arcs 201–208 and 211–215. Control bits as described above are associated with each arc. In FIG. 2 control bit names preceded by the symbol~are low along the corresponding arc. Along other arcs the corresponding control bits are high.

The system begins in a rest state 21, where it stays for as long as it is not shifting (indicated by ~shift along arc 204). Once the shift bit goes high (arc 211), the system enters a header state 22, where it prepares to read or write CAM 14. If some register other than CAM 14 has been selected (~cam_addr), then the system follows arc 203 back to rest state 21. Otherwise, if the write bit is high, then it follows arc 212 into a wwait state 23, where it stays until shift counter 15 signals that all the appropriate bits have shifted in and are aligned for a set of eight writes. Once that moment arrives, the wready signal goes high and the system follows arc 214 to a write state 24. In write state 24, CAM shift control 13 drives cam_write and cac_dec high, which causes the data in STG 12 to be written sequentially to each slot of CAM 14 starting with slot 7 and ending with slot 0. Once the eight writes are completed, shift counter 15 drives 8writes high, and the system returns along arc 201 back to rest state 21.

For a read, the path starts in rest state 21 and proceeds to header state 22 as before. In the case of a read, the write bit is low, so the system proceeds to a read state 25. While in the read state, CAM shift control 13 drives cam_to_stg and cac_dec high, causing data from CAM 14 to be read and driven to CAM data buffer 16, which in turn drives it onto bits 8, 16, 24, 32, 40, 48, 56, 64, 72, and 80 of rbus 110. Since the write bit is low, STG 12 reads the data from rbus 110 and shifts it out. In this manner all 8 CAM slots are read sequentially, starting with slot 7 and ending with slot 0. Once the 8 reads have occurred, shift counter 15 drives 8reads high, and the system follows arc 215 to an rwait state 26 to allow time for the read data to shift out of STG 12. Once that has occurred, shift counter 15 drives rready high, and the system returns along arc 202 back to rest state 21.

It should be noted that the external write bit is applied directly to CAM shift control 13, so that the state machine can decide whether to follow arc 212 to wwait state 23 or arc 213 to read state 25. Additionally, shift counter 15 needs the external write bit separately, so that it can decide whether to produce the wready bit or the rready bit. The cam_addr bit is an external control input to the system and is guaranteed high when following arc 212 or 213, but otherwise its value is ignored.

The described embodiments communicate with a 10-bit CAM which has 8 slots. They access each slot 'on the fly' while a staging register is shifting. The embodiments handle that operation quickly, efficiently, and with a maximum utilization of existing hardware. The principles of the invention can be applied to a variety of conditions, including various datapath widths and numbers of CAM slots, for example 16 CAM slots each 6 bits wide. Alternatively, the CAM can be replaced by a register file or a small segment of memory, or a collection of narrow registers that communicate with a wide staging register.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for writing to and reading from a memory device comprising:

a memory device containing a plurality M of memory registers, each of said M memory registers configured to accommodate X bits of information;

a staging register having a serial data input port and a serial data output port connected in series with N consecutive memory elements such that N is greater than the product of M and X, wherein M, N, and X are each positive integers, each such memory element configured to accommodate a data bit, said staging register configured to shift said data bits serially into said staging register through said serial data input port, through each of said consecutive memory elements, and out through said serial data output port; and said staging register being interconnected with an input port of said memory device, such that a first set of X non-adjacent memory elements of said staging register separated from one another by equal spacings of M said consecutive memory elements are interconnected with said input port of said memory device.

2. The system of claim 1 wherein N is greater than twice the product of M and X.

3. The system of claim 1 wherein N is 152.

4. The system of claim 1 wherein M is eight and X is 10.

5. The system of claim 1 wherein said memory device is selected from a group consisting of a register file, a segment of larger memory, and a content addressable memory (CAM).

6. The system of claim 5 wherein said M memory registers are CAM slots.

7. The system of claim 1 further comprising an output port of said memory device interconnected through a data buffer with said staging register, such that a second set of X non-adjacent memory elements of said staging register separated from one another by equal spacings of M said consecutive memory elements are interconnected through said data buffer.

8. The system of claim 7 wherein said first set and said second set of X non-adjacent memory elements are offset relative to one another by M consecutive memory elements.

9. The system of claim 1 further comprising an address counter, said address counter being connected to an address port of said memory device.

10. A method of writing to and reading from a memory device having a plurality M of memory registers, each of said M registers containing X bits of information, wherein M and X are both positive integers, said method comprising:
   a. interleaving bits of information from M parallel datastreams into a serial bitstream, such that all of the bit zeros of the M parallel datastreams flow first in said serial bitstream, followed by all of the bit ones, next by the bit twos, and subsequently by all of the bit (X–1)s, such that M×X bits are interleaved;
   b. aligning said serial bitstream relative to an input port of said memory device, such that all bit values from a selected parallel datastream are disposed to transfer simultaneously in parallel to a predetermined memory register of said memory device;
   c. simultaneously writing all of said bit values of said selected parallel datastream to said predetermined memory register of said memory device;
   d. determining a next memory register and simultaneously shifting said serial bitstream relative to said input port, such that all bit values from a next selected parallel datastream corresponding to said next memory register are disposed to transfer simultaneously in parallel to said next memory register; and
   e. iterating operations c and d above, until all memory registers are written.

11. The method of claim 10 wherein said interleaving is implemented in software.

12. The method of claim 10 wherein said interleaving is implemented in hardware.

13. The method of claim 10 wherein said aligning and shifting are implemented in a staging register having N consecutive memory elements, wherein N is a positive integer greater than the product of M and X.

14. The method of claim 13 wherein N is greater than twice the product of M and X.

15. The method of claim 10 wherein said memory device is selected from a group consisting of a register file, a segment of memory, and a content addressable memory (CAM).

16. The method of claim 15 wherein said M memory registers are CAM slots.

17. The method of claim 10 wherein M is eight.

18. The method of claim 10 wherein said determining a next memory register comprises decrementing an address counter.

19. The method of claim 10 wherein said simultaneously writing operation occurs within a single clock period.

20. The method of claim 19 wherein M consecutive write operations occur within M consecutive clock periods.

21. A method of writing to and reading from a memory device having a plurality M of memory registers, each of said M registers containing X bits of information, wherein M and X are both positive integers, said method comprising:
   a. aligning a serial bitstream among memory elements within a staging register relative to an output datastream of said memory device, such that all bit values from a predetermined memory register of said memory device are disposed to transfer simultaneously in parallel to selected uniformly spaced non-adjacent memory elements of said staging register;
   b. simultaneously reading all of said bit values of said predetermined memory register of said memory device into said selected uniformly spaced non-adjacent memory elements of said staging register within said serial bitstream;
   c. determining a next memory register and simultaneously unidirectionally shifting said serial bitstream relative to said selected uniformly spaced non-adjacent memory elements within said staging register, such that all bit values read into said selected uniformly spaced non-adjacent memory elements in operation b are uniformly interleaved relative to corresponding said selected uniformly spaced non-adjacent memory elements;
   d. iterating operations b and c above, until all memory registers are read;
   e. shifting said serial bitstream out of said staging register; and
   f. de-interleaving bits of information from said serial bitstream, such that M parallel datastreams are reconstructed, each said parallel datastream corresponding to a preselected memory register of said memory device.

* * * * *